United States Patent
Deguchi et al.

(10) Patent No.: US 8,955,942 B2
(45) Date of Patent: Feb. 17, 2015

(54) LIQUID DROPLET JETTING APPARATUS AND PIEZOELECTRIC ACTUATOR

(71) Applicants: Masaaki Deguchi, Chiryu (JP); Shohei Koide, Nagoya (JP)

(72) Inventors: Masaaki Deguchi, Chiryu (JP); Shohei Koide, Nagoya (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 13/850,368

(22) Filed: Mar. 26, 2013

(65) Prior Publication Data

US 2013/0286106 A1  Oct. 31, 2013

(30) Foreign Application Priority Data

Apr. 27, 2012  (JP) .................. 2012-102790

(51) Int. Cl.
| | |
|---|---|
| *B41J 2/045* | (2006.01) |
| *B41J 2/015* | (2006.01) |
| *H01L 41/047* | (2006.01) |
| *B41J 2/14* | (2006.01) |

(52) U.S. Cl.
CPC ......... *H01L 41/0477* (2013.01); *B41J 2/14201* (2013.01); *B41J 2/14233* (2013.01); *B41J 2002/14266* (2013.01); *B41J 2002/14459* (2013.01); *B41J 2002/14491* (2013.01)
USPC ............................................. 347/20; 347/68

(58) Field of Classification Search
None
See application file for complete search history.

(56) References Cited

U.S. PATENT DOCUMENTS

| | | | | |
|---|---|---|---|---|
| 7,560,852 | B2 * | 7/2009 | Sugahara ...................... | 310/311 |
| 2011/0168806 | A1 * | 7/2011 | Nakamura .................. | 239/102.2 |

FOREIGN PATENT DOCUMENTS

| | | |
|---|---|---|
| JP | 2012-056288 | 3/2012 |
| JP | 2012056288 A * | 3/2012 |

\* cited by examiner

*Primary Examiner* — Matthew Luu
*Assistant Examiner* — Erica Lin
(74) *Attorney, Agent, or Firm* — Frommer Lawrence & Haug LLP

(57) ABSTRACT

A liquid droplet jetting apparatus includes a flow passage structural body having a nozzle and a pressure chamber communicated with the nozzle, and a piezoelectric actuator provided on the flow passage structural body to apply jetting energy to a liquid inside the pressure chamber. The piezoelectric actuator has a piezoelectric layer arranged to face the pressure chamber, a low-potential electrode provided on the piezoelectric layer, and a high-potential electrode provided on the piezoelectric layer and to which a higher potential is applied than to the low-potential electrode. The high-potential electrode has a first electrode layer arranged to contact with the piezoelectric layer and formed of gold, and a second electrode layer stacked on the first electrode layer to extend in a predetermined direction, having a width shorter than that of the first electrode layer, and formed of a conductive material more likely to cause migration than gold.

13 Claims, 8 Drawing Sheets

LIQUID DROPLET JETTING APPARATUS AND PIEZOELECTRIC ACTUATOR

CROSS REFERENCE TO RELATED APPLICATION

The present application claims priority from Japanese Patent Application No. 2012-102790, filed on Apr. 27, 2012, the disclosure of which is incorporated herein by reference in its entirety.

BACKGROUND OF THE INVENTION

1. Field of the Invention

The present invention relates to a liquid droplet jetting apparatus having a piezoelectric actuator, and the piezoelectric actuator.

2. Description of the Related Art

Japanese Patent Application Laid-Open No. 2012-56288 discloses an ink-jet head which jets liquid droplets of ink as a liquid droplet jetting apparatus which jets liquid droplets from nozzles. The ink-jet head of Japanese Patent Application Laid-Open No. 2012-56288 includes a flow passage unit, and a piezoelectric actuator (an actuator unit) provided on the flow passage unit. In the flow passage unit, ink flow passages are formed to include a plurality of nozzles, and a plurality of pressure chambers in respective communication with the plurality of nozzles. The piezoelectric actuator is joined to the flow passage unit in such a manner as to cover the plurality of pressure chambers.

The piezoelectric actuator has a plurality of stacked piezoelectric layers, a plurality of individual electrodes formed on a surface of an uppermost piezoelectric layer, and a common electrode arranged between the uppermost piezoelectric layer and a lowermost or an intermediate piezoelectric layer. The plurality of individual electrodes are arranged on the surface of the uppermost piezoelectric layer in areas facing the plurality of pressure chambers, respectively. Further, the plurality of individual electrodes and the common electrode are formed of gold, respectively. The plurality of individual electrodes are connected to a wiring member (Flexible Printed Circuit: FPC) on which a driver IC is mounted, and the driver IC applies a drive voltage (a high potential) to the plurality of individual electrodes respectively. On the other hand, the common electrode is also connected to the FPC, but constantly kept at the ground potential. If the driver IC applies the drive voltage to a certain individual electrode to generate a potential difference between the individual electrode and the common electrode, then an electric filed acts on the piezoelectric layers in the portion sandwiched by the two electrodes to bring about a deformation. This deformation causes the corresponding pressure chamber to change in volume, thereby applying jetting energy (pressure) to the ink inside the pressure chamber.

However, when the potential difference occurs between the two electrodes sandwiching the insulating body, a phenomenon called migration may occur such that the metallic material of the electrodes is ionized, and the ionized metal is affected by the electric field to move within the insulating body. If the piezoelectric actuator is such as disclosed in Japanese Patent Application Laid-Open No. 2012-56288, then the material of the individual electrode, to which the high potential is applied, is ionized to move within the piezoelectric layers toward the common electrode at the ground potential. This migration should be restrained as much as possible because it can cause some fatal problems to the piezoelectric actuator such as decrease in insulation performance of the piezoelectric layers, short circuits between the electrodes, etc. In this regard, the individual electrodes and the common electrode are formed of gold, respectively, in the piezoelectric actuator of Japanese Patent Application Laid-Open No. 2012-56288. Gold is a very stable substance, and thus is one of the materials less likely to give rise to the migration.

However, gold is also a very expensive material, and gold electrodes are formed to be as thin as possible (for example, 1 μm in Japanese Patent Application Laid-Open No. 2012-56288). Further, increasing the thickness of the individual electrodes gives rise to such a problem as inhibiting the piezoelectric layers from deformation. In this regard, it is also preferable to form gold individual electrodes thinly. On the other hand, however, because piezoelectric layers made of ceramic materials have a low toughness, they are liable to crack. Then, when crack occurs in the piezoelectric layers, the thin individual electrodes are liable to break up. If the individual electrodes are completely divided due to the crack, then the potential is only applicable to a part of the individual electrode, thereby making it impossible to operate the piezoelectric actuator.

SUMMARY OF THE INVENTION

An object of the present invention is to restrain the occurrence of migration by using gold to form high-potential electrodes, while preventing the high-potential electrodes from breaking up due to crack and the like of the piezoelectric layers.

According to a first aspect of the present invention, there is provided a liquid droplet jetting apparatus configured to jet liquid droplets of a liquid, including: a flow passage structural body having a nozzle through which the liquid droplets are jetted and a pressure chamber communicated with the nozzle; and a piezoelectric actuator provided on the flow passage structural body and configured to apply jetting energy to the liquid inside the pressure chamber, wherein the piezoelectric actuator has: a piezoelectric layer arranged to face the pressure chamber; a low-potential electrode provided on the piezoelectric layer; and a high-potential electrode provided on the piezoelectric layer and configured to be applied a potential which is higher than a potential to be applied to the low-potential electrode; and wherein the high-potential electrode has: a first electrode layer arranged to make contact with the piezoelectric layer and formed of gold; and a second electrode layer stacked on the first electrode layer to extend in a predetermined direction, having a length in a direction perpendicular to the predetermined direction which is shorter than that of the first electrode layer, and formed of a conductive material which is more likely to cause migration than gold.

According to the first aspect of the present invention, the high-potential electrode of the piezoelectric actuator, to which a higher potential is applied, has the first electrode layer, and the second electrode layer stacked on the first electrode layer. Here, the first electrode layer in contact with the piezoelectric layer is formed of gold which is a material less likely to cause the migration. Therefore, the migration is less likely to occur with the high-potential electrode.

Further, because the second electrode layer is stacked on the first electrode layer to extend in the predetermined direction, even if the first electrode layer formed of gold is thin in its thickness, and thus crack occurs in the piezoelectric layer, etc., to cause the first electrode layer to break up, the second electrode layer can still prevent the high-potential electrode from break up. Further, the second electrode layer is formed to have an elongated shape with a shorter length (also simply referred to as "width" hereinbelow) than the first electrode layer in the direction perpendicular to the predetermined direction. Hence, the second electrode layer is less likely to inhibit the piezoelectric layer from deformation. Further, the second electrode layer is formed of a material more likely to cause the migration than gold. Generally, materials more likely to cause the migration are less expensive than gold. Therefore, a lower cost is maintained in comparison with the case of increasing the thickness of the first electrode layer formed of gold in order to prevent its break-up due to the crack or the like in the piezoelectric layer. Further, because the first electrode layer made of gold intervenes between the second electrode layer and the piezoelectric layer, even if the second electrode layer is formed of a conductive material more likely to cause the migration, there is still no migration to occur with this second electrode layer.

According to a second aspect of the present invention, there is provided piezoelectric actuator including: a piezoelectric layer; a low-potential electrode provided on the piezoelectric layer; and a high-potential electrode provided on the piezoelectric layer and configured to be applied a potential which is higher than a potential to be applied to the low-potential electrode, wherein the high-potential electrode has: a first electrode layer arranged to make contact with the piezoelectric layer and formed of gold; and a second electrode layer stacked on the first electrode layer to extend in a predetermined direction, having a length in a direction perpendicular to the predetermined direction which is shorter than that of the first electrode layer, and formed of a conductive material which is more likely to cause migration than gold.

In the piezoelectric actuator according to the second aspect of the present invention, because the first electrode layer of the high-potential electrode in contact with the piezoelectric layer is formed of gold, the migration is less likely to occur with the high-potential electrode. Further, because the second electrode layer is formed to have an elongated shape, and stacked on the first electrode layer to extend in the predetermined direction, even if crack occurs in the piezoelectric layer to cause the first electrode layer to break up, the second electrode layer can still prevent the high-potential electrode from break up. Further, because the second electrode layer has the elongated shape, it is less likely to inhibit the piezoelectric layer from deformation. Further, because the second electrode layer is formed of a material more likely to give rise to the migration than gold, a low cost is maintained.

DESCRIPTION OF THE PREFERRED EMBODIMENT

Figure 1:
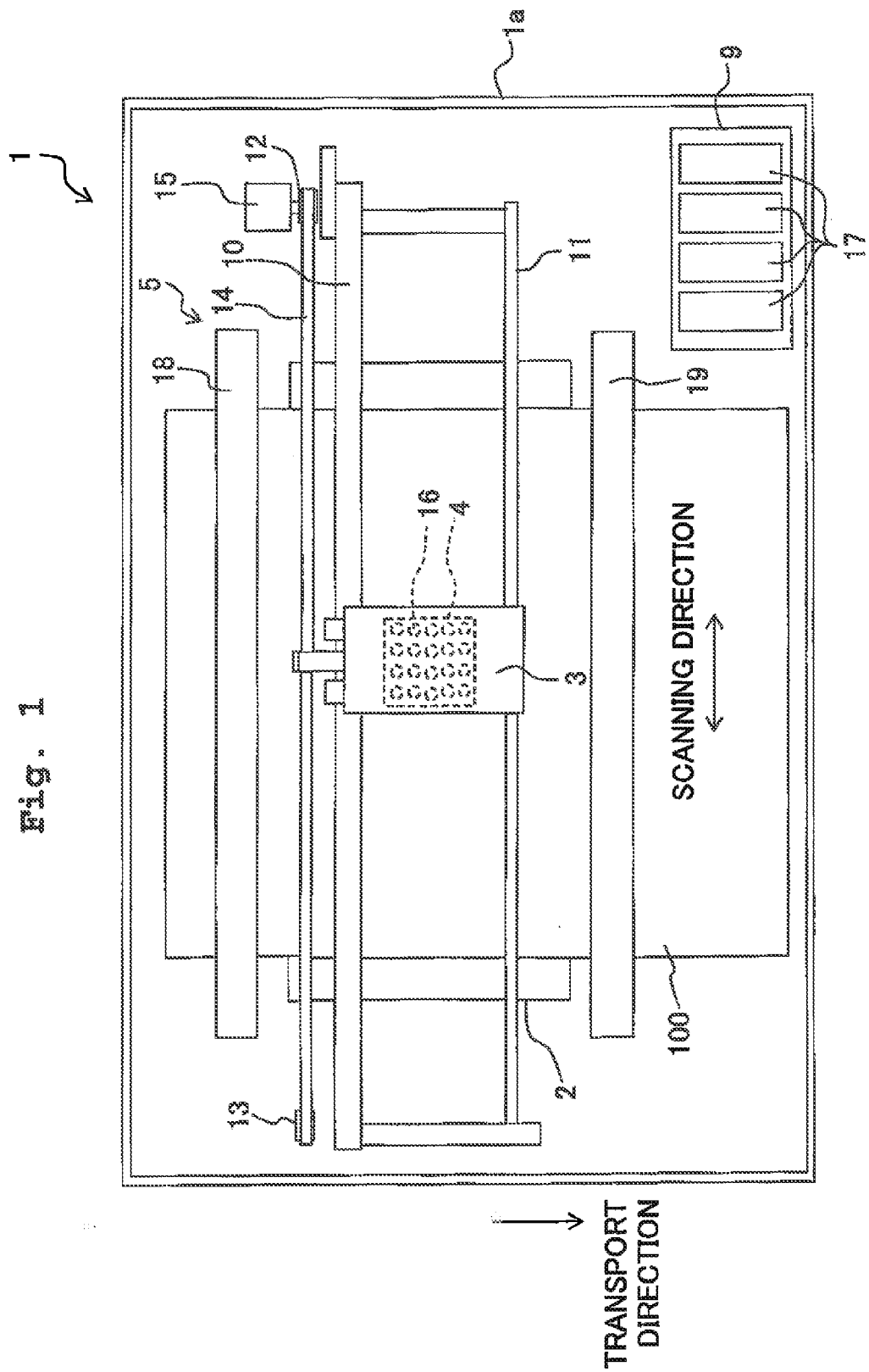
FIG. 1 is a schematic plan view of an ink jet printer in accordance with an embodiment of the present invention.

Next, an embodiment of the present invention will be explained. First, referring to FIG. 1, a schematic construction of an ink jet printer 1 will be explained. Further, in the following explanation, the front side of the page of FIG. 1 is defined to be the upper side while the back side of the page is defined to be the lower side, and the directional terms "upper" and "lower" are used as appropriate. As shown in FIG. 1, the ink jet printer includes a platen 2, a carriage 3, an ink-jet head 4, a transport mechanism 5, etc.

A sheet of recording paper 100, which is a recording medium, is placed on the upper surface of the platen 2. Further, above the platen 2, two guide rails 10 and 11 are provided to extend parallely in a left-right direction (a scanning direction) of FIG. 1. The carriage 3 is configured to be movable reciprocatingly in the scanning direction along the two guide rails 10 and 11 in an area facing the platen 2. Further, the carriage 3 is connected to an endless belt 14 put around two pulleys 12 and 13. When a carriage drive motor 15 drives the endless belt 14 to move, the carriage 3 moves in the scanning direction along with the motion of the endless belt 14.

The ink-jet head 4 (a liquid droplet jetting apparatus) is installed on the carriage 3, and moves along with the carriage 3 in the scanning direction. A plurality of nozzles 16 are formed on the lower surface of the ink-jet head 4 (the surface on the back side of the page of FIG. 1). Further, as shown in FIG. 1, a holder 9 is provided in a printer main body 1a of the ink jet printer 1. Four ink cartridges 17 containing four color inks (black, yellow, cyan and magenta) respectively are installed in the holder 9. Although illustration is omitted, the ink-jet head 4 mounted on the carriage 3 is connected with the holder 9 through four tubes (not shown). The four color inks of the four ink cartridges 17 are supplied respectively to the ink-jet head 4 through the four tubes. The ink-jet head 4 jets the inks supplied from the ink cartridges 17 to the recording paper 100 placed on the platen 2 from the plurality of nozzles 16.

The transport mechanism 5 has two transport rollers 18 and 19 arranged to interpose the platen 2 in a transport direction, and these two transport rollers 18 and 19 are driven to rotate by an unshown motor. The transport mechanism 5 transports the recording paper 100 placed on the platen 2 in the transport direction by the two transport rollers 18 and 19.

The ink jet printer 1 causes the inks to be jetted from the ink-jet head 4 moving reciprocatingly along with the carriage 3 in the scanning direction (the left-right direction in FIG. 1) to the recording paper 100 placed on the platen 2. At the same time, the two transport rollers 18 and 19 transport the recording paper 100 in the transport direction (downward direction in FIG. 1). By the above operation, images, characters and the like are recorded on the recording paper 100.

Figure 3:
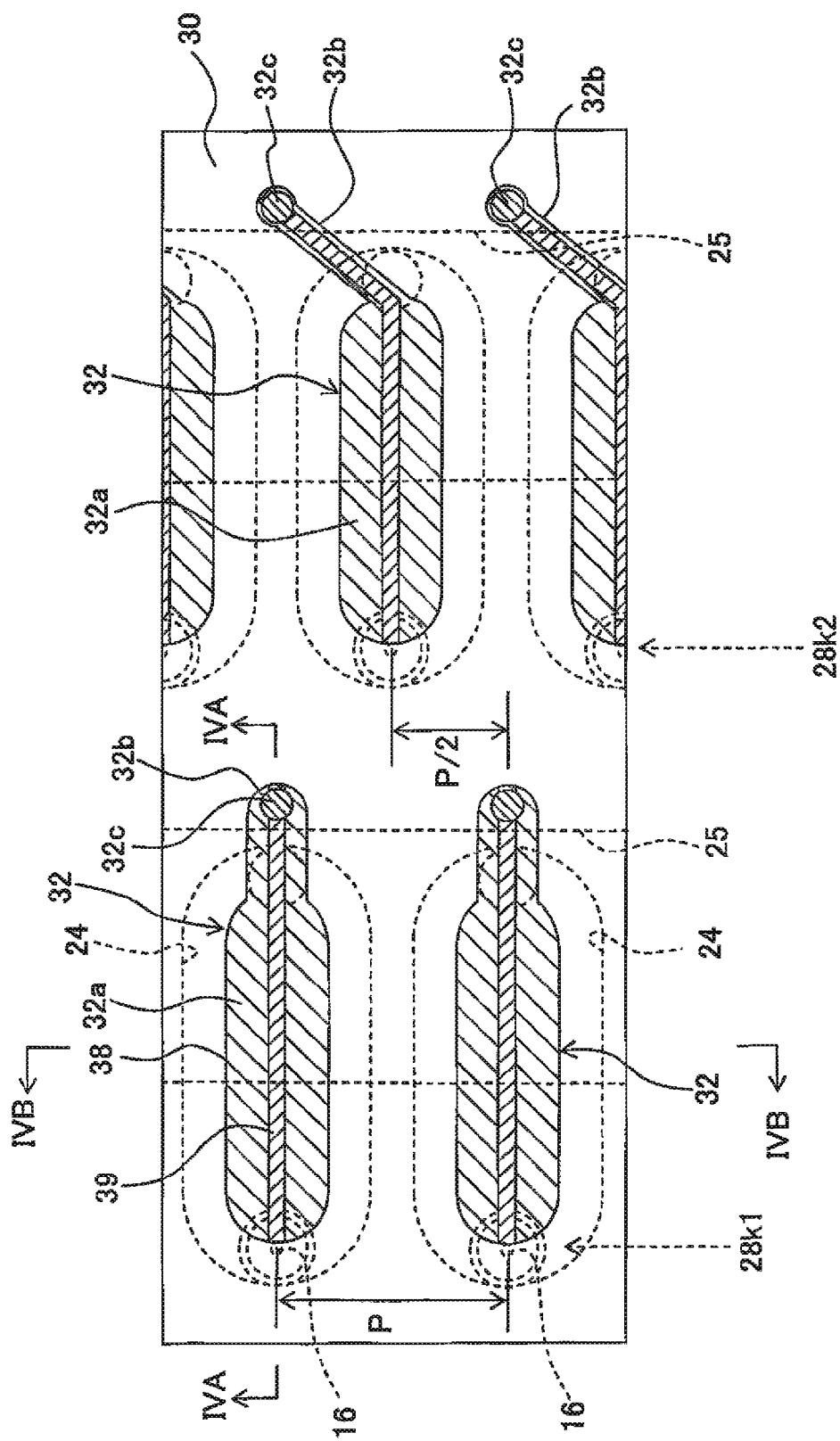
FIG. 3 is an enlarged view of part A of FIG. 2.
Figure 4A:
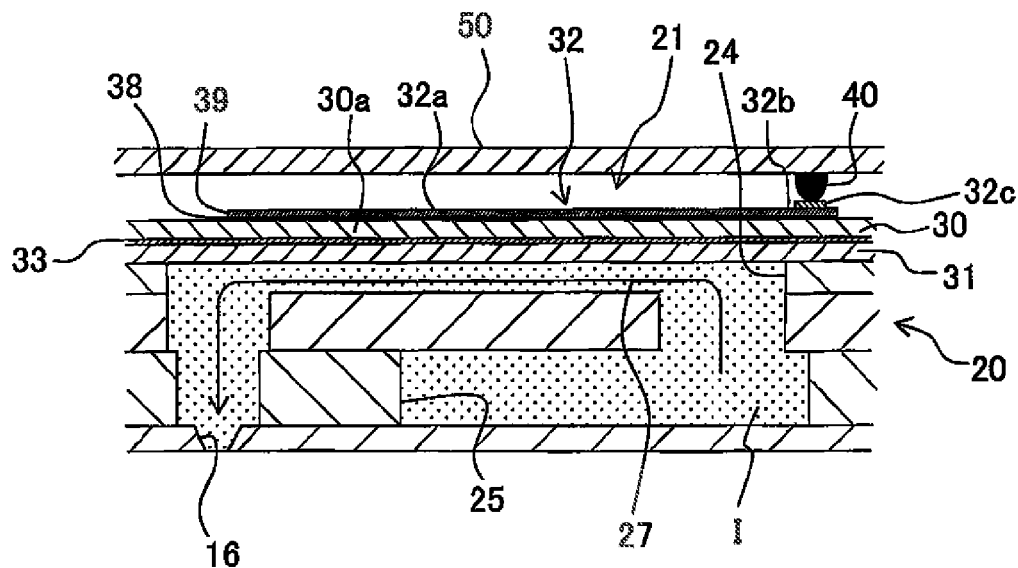
FIG. 4A is a cross-sectional view along the line IVA-IVA in FIG. 3.
Figure 4B:
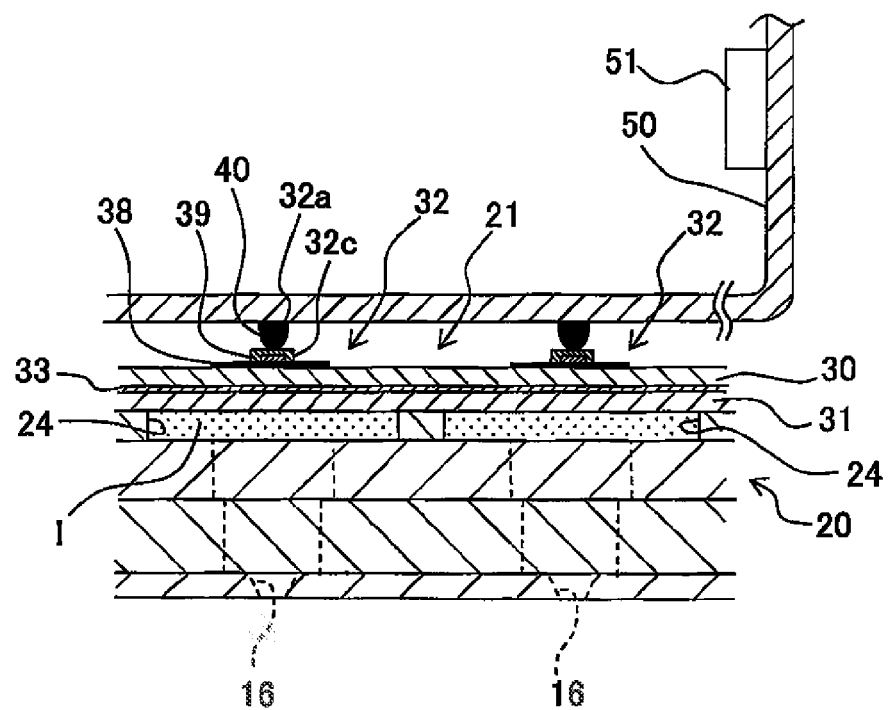
FIG. 4B is a cross-sectional view along the line IVB-IVB in FIG. 3.

Next, referring to FIGS. 2 to 4A and 4B, the ink-jet head 4 will be explained. Further, FIGS. 2 and 3 omit the illustration of a COF 50 which is shown in FIGS. 4A and 4B. As shown in FIGS. 2 to 4A and 4B, the ink-jet head 4 includes a flow passage unit 20 (a flow passage structural body), and a piezoelectric actuator 21.

As shown in FIGS. 4A and 4B, the flow passage unit 20 has such a structure as stacking four plates in which many flow passage formation holes are formed respectively. By letting the many flow passage formation holes communicate with each other when the four plates are stacked, such ink flow passages are formed in the flow passage unit 20 as follows. Further, in FIGS. 4A and 4B, the symbol "I" shows the ink filling the inside of the ink flow passages.

Figure 2:
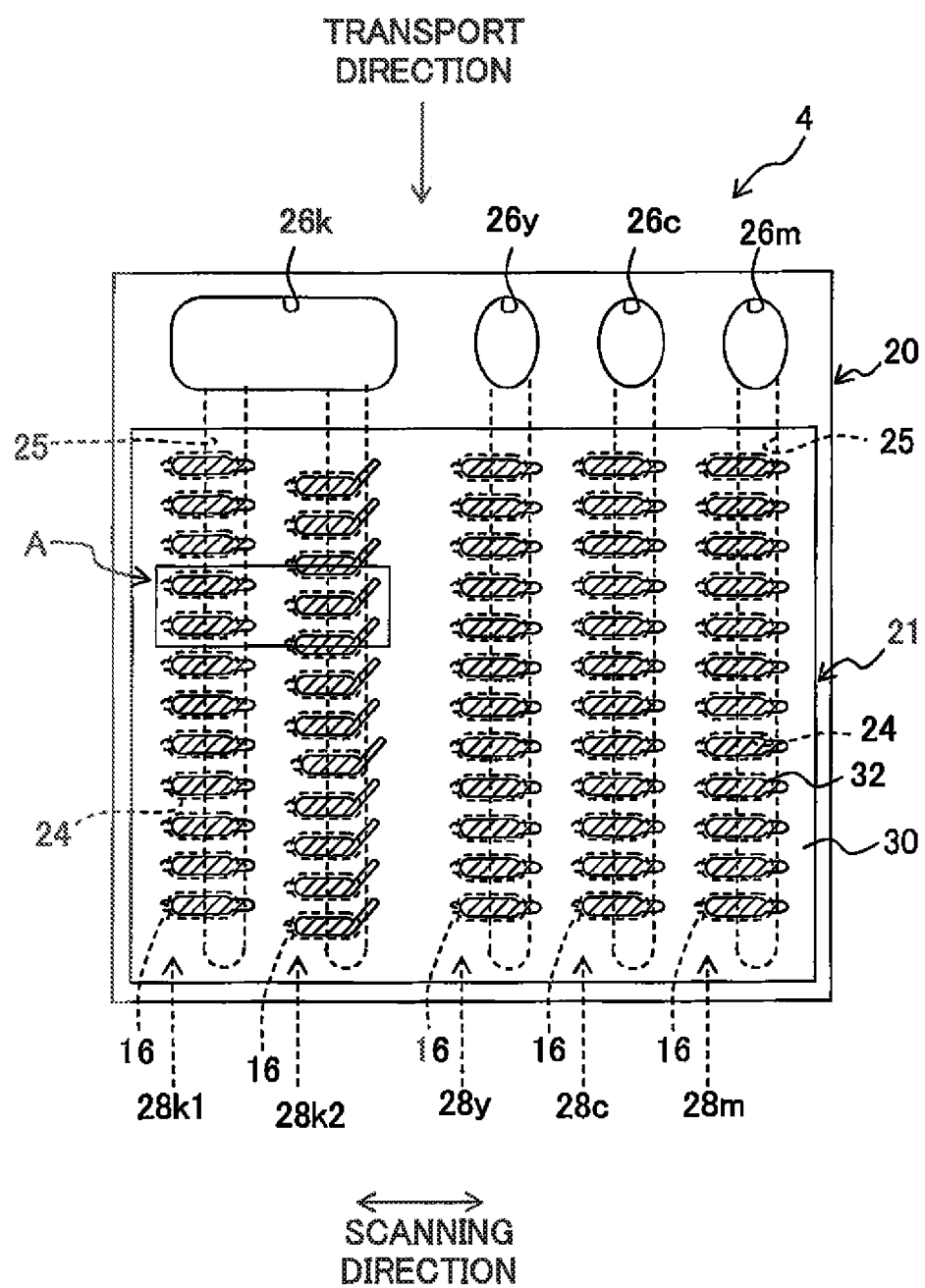
FIG. 2 is a plan view of an ink-jet head.

As shown in FIG. 2, on the upper surface of the flow passage unit 20, four ink supply holes 26k, 26y, 26c and 26m are formed in respective connection with the four ink cartridges 17. Further, the ink supply hole 26k in connection with the ink cartridge 17 of the black ink is larger than the three ink supply holes 26*y*, 26*c* and 26*m* in respective connection with the ink cartridges 17 of the three color inks (yellow, cyan and magenta).

Inside the flow passage unit 20, five manifolds 25 are formed to extend respectively in the transport direction. Among the five manifolds 25, the two manifolds 25 on the left side in FIG. 2 are connected with the ink supply hole 26*k* to be supplied with the black ink. On the other hand, the three manifolds 25 on the right side are connected respectively with the three ink supply holes 26*y*, 26*c* and 26*m* to be supplied respectively with the three color inks.

As shown in FIGS. 4A and 4B, the flow passage unit 20 has the plurality of nozzles 16 on its lower surface, and a plurality of pressure chambers 24 in respective communication with the plurality of nozzles 16. Each of the plurality of pressure chambers 24 has such a planar shape as is approximately elliptic and long in the scanning direction. As shown in FIG. 2, the plurality of nozzles 16 and the plurality of pressure chambers 24 are aligned in five rows to correspond respectively to the five manifolds 25. That is, the flow passage unit 20 has two nozzle rows 28*k*1 and 28*k*2 in communication with the two manifolds 25 on the left side to jet the black ink, and three nozzle rows 28*y*, 28*c* and 28*m* in respective communication with the three manifolds 25 on the right side to respectively jet the three color inks (yellow, cyan and magenta). Further, as shown in FIGS. 2 and 3, the two nozzle rows 28*k*1 and 28*k*2 jetting the black ink are arranged to mutually deviate in the transport direction by half the alignment pitch P of each nozzle row (P/2). Further, the two rows of the pressure chambers 24 are also arranged to mutually deviate by P/2 to correspond to the two nozzle rows 28*k*1 and 28*k*2.

As shown in FIG. 4A, each of the pressure chambers 24 communicates with the corresponding manifold 25. By virtue of this, a plurality of individual ink flow passages 27 are formed in the flow passage unit 20 to branch from the manifolds 25 through the pressure chambers 24 to the nozzles 16.

Next, the piezoelectric actuator 21 will be explained. The piezoelectric actuator 21 is arranged on the upper surface of the flow passage unit 20. As shown in FIGS. 2 to 4A and 4B, the piezoelectric actuator 21 has two piezoelectric layers 30 and 31, a plurality of individual electrodes 32, and a common electrode 33.

Being stacked on each other, the two piezoelectric layers 30 and 31 are arranged on the upper surface of the flow passage unit 20 to cover the plurality of pressure chambers 24. The two piezoelectric layers 30 and 31 are respectively made of a piezoelectric material which is composed primarily of ferroelectric lead zirconate titanate (i.e. PZT), and is a solid solution of lead titanate and lead zirconate.

The plurality of individual electrodes 32 (the high-potential electrodes) are formed on the upper surface of the upper piezoelectric layer 30 to correspond respectively to the plurality of pressure chambers 24. Each of the individual electrodes 32 has a main electrode portion 32*a*, a sub electrode portion 32*b*, and a connection terminal 32*c*. As shown in FIG. 3, each of the main electrode portions 32*a* has a planar shape of an approximate ellipse which is a little smaller than the approximately elliptic pressure chamber 24, and faces the central portion of the pressure chamber 24. On the upper surface of the piezoelectric layer 30, each of the sub electrode portions 32*b* is pulled out from the main electrode portion 32*a* up to a position facing outside area of the pressure chamber 24. Further, as shown in FIGS. 2 and 3, between the individual electrodes 32 corresponding to the nozzle row 28*k*2 and the individual electrodes 32 corresponding to the other nozzle rows 28 (28*k*1, 28*y*, 28*c* and 28*m*), the pullout directions of the sub electrode portions 32*b* are different, and this will be described hereinafter. Each of the connection terminals 32*c* is formed at the end portion of the sub electrode portion 32*b*. Above the piezoelectric actuator 21, the COF 50 (a wiring member) is arranged to mount a driver IC 51 thereon to drive the piezoelectric actuator 21. The connection terminals 32*c* of the plurality of individual electrodes 32 are connected to the COF 50 by bumps 40. By the above construction, the plurality of individual electrodes 32 of the piezoelectric actuator 21 are connected electrically with the driver IC 51.

Further, as shown in FIGS. 3 to 4A and 4B, the main electrode portions 32*a* facing the pressure chambers 24 and their extensional sub electrode portions 32*b* of the individual electrodes 32 are each formed of a first electrode layer 38 in contact with the piezoelectric layer 30 and a second electrode layer 39 stacked on the first electrode layer 38. Each of the first electrode layers 38 is formed of gold (Au), and has such a shape extending in the longitudinal direction of the pressure chamber 24. On the other hand, each of the second electrode layers 39 is formed of a conductive paste of silver (Ag) or silver-palladium (Ag—Pd) alloy to which glass powder is added. Each of the second electrode layers 39 extends over the entire length of the first electrode layer 38 along the longitudinal direction of the pressure chamber 24. Further, the width of the second electrode layer 39 (the length in the lateral direction of the pressure chamber 24) is less than that of the first electrode layer 38.

In analogy with the second electrode layers 39, each of the connection terminals 32*c* is also formed by the conductive paste material of Ag or Ag—Pd alloy to which glass powder is added. As shown in FIG. 3, each of the connection terminals 32*c* is stacked on the portion of the first electrode layer 38 and the second electrode layer 39 constituting the sub electrode portion 32*b*. Further, each of the connection terminals 32*c* is sized to fall within the first electrode layer 38 in planar view. That is, each of the first electrode layers 38 intervenes between the connection terminal 32*c* and the piezoelectric layer 30, and thus each of the connection terminals 32*e* is not in direct contact with the piezoelectric layer 30. Further, because the second electrode layers 39 and the connection terminals 32*c* are made of the same material, they can be formed at one time by screen printing or the like, for example, and thus can be formed more simply than in the case of different materials.

The common electrode 33 (the low-potential electrode) is arranged through almost the entire area between the two piezoelectric layers 30 and 31 to face the plurality of individual electrodes 32 commonly across the piezoelectric layer 30. Further, although illustration is omitted, the common electrode 33 is constantly kept at the ground potential by being electrically connected to a ground wire (not shown) of the COF 50. In analogy with the second electrode layers 39 of the individual electrodes 32, the common electrode 33 is also formed by the conductive paste of silver (Ag) or silver-palladium (Ag—Pd) alloy. Alternatively, the common electrode 33 may also be formed by gold in analogy with the first electrode layers 38 of the individual electrodes 32.

Further, the portions (to be referred to as active portions 30*a* hereinbelow) of the piezoelectric layer 30 sandwiched by the plurality of individual electrodes 32 and the common electrode 33 are polarized, in advance, in the thickness direction.

While the method of producing the above piezoelectric actuator 21 is not limited to any specific method, it is possible to produce it, for example, in the following manner. First, the common electrode 33 is formed on an unfired green sheet. After forming the common electrode 33, two green sheets are stacked to sandwich the common electrode 33, and then fired at a high temperature. Next, the plurality of individual electrodes 32 are formed on a surface of the stacked green sheets. The first electrode layers 38 of the individual electrodes 32 are formed by, for example, letting gold particulates adhere to the surface of the green sheet through vacuum deposition. Further, the second electrode layers 39 of the individual electrodes 32 and the common electrode 33 are formed by letting the conductive paste of Ag or Ag—Pd, to which glass powder is added, adhere to the green sheet through screen printing or the like. After forming the individual electrodes 32, the two green sheets are fired at a high temperature. Further, as for the second electrode layers 39 and common electrode 33 made of Ag or Ag—Pd, because the glass powder included in the conductive paste is melted when the green sheets are fired, it is possible to increase the adhesion of the second electrode layers 39 to the first electrode layers 38, and the adhesion of the common electrode 33 to the piezoelectric layer 30.

Further, as described above, in the flow passage unit 20, the pressure chambers 24 for the black ink are aligned in two rows, and the two rows of the pressure chambers 24 are arranged to mutually deviate in the transport direction by half the alignment pitch P of the nozzles 16 (see FIGS. 2 and 3). Corresponding to this alignment of the pressure chambers 24, the individual electrodes 32 for the black ink are also aligned in two rows. Here, as for the individual electrodes 32 aligned in two rows, the sub electrode portions 32b may be all pulled out from the main electrode portions 32a in the same direction. In this embodiment, however, between the two rows of the individual electrodes 32 aligned, in order to coordinate or conform the positions of the connection terminals 32c in the transport direction, the shape of the sub electrode portions 32b of one row of the individual electrodes 32 is changed to differentiate the pullout directions from the main electrode portions 32a.

In more detail, as for the individual electrodes 32 of the left row in FIGS. 2 and 3, the sub electrode portions 32b are pulled out straight along the longitudinal direction of the main electrode portions 32a (rightward in the figures). On the other hand, as for the individual electrodes 32 of the right row in FIGS. 2 and 3, the sub electrode portions 32b are pulled out obliquely to the longitudinal direction of the main electrode portions 32a. By differentiating the pullout directions of the sub electrode portions 32b in this manner, with respect to two individual electrodes 32 on the left and right sides with positional deviation by P/2 in the transport direction, positions are conformed in the transport direction for the connection terminals 32c provided at the end portions of the sub electrode portions 32b.

Further, between the two rows of the individual electrodes 32 aligned, the reason for conforming the positions in the transport direction for the connection terminals 32c is as follows. In this embodiment as shown in FIG. 4B, the COF 50 is not only pulled out from the piezoelectric actuator 21 in the transport direction (the alignment direction of the nozzles 16), but also folded upward. In such case, a force acts on the junction portions of the COF 50 with the plurality of connection terminals 32c in a separative direction. Especially, the force acts to the greatest extent on the junction portions of the COF 50 with the connection terminals 32c positioned at the end on the pullout side. Therefore, between the two rows of the individual electrodes 32, if the positions are not conformed in the transport direction for the aforementioned two connection terminals 32c positioned at the end on the pullout side, then the separative force may concentrically act on the junction portion of the one connection terminal 32c positioned the farthest on the pullout side. Hence, by conforming the positions in the transport direction for the two connection terminals 32c positioned at the end on the pullout side, the separative force is dispersed, thereby making it possible to restrain separation of the COF 50.

Further, as for the other connection terminals 32c besides those positioned at the end on the pullout side, the separative force dose not change much with the position in the transport direction. However, in one row of the individual electrodes 32, it is advantageous to align the connection terminals 32c at equal intervals in the transport direction from the viewpoint of preventing the migration between the connection terminals 32c. Therefore, along with conforming the positions in the transport direction for the aforementioned two connection terminals 32c positioned at the end on the pullout side, between any two rows of the individual electrodes 32, positions are all conformed in the transport direction for the connection terminals 32e.

However, if the sub electrode portions 32b have different shapes between the two rows of the individual electrodes 32 aligned, then the electrode areas become different between these two types of the sub electrode portions 32b. In this case, the total electrode areas also become different between these two types of the individual electrodes 32, thereby bringing on different areas (capacitances) of the active portions 30a sandwiched between the individual electrodes 32 and the common electrode 33. This results in different jetting characteristics (jetting speeds of the liquid droplets and/or volumes of the jetted liquid droplets) between the two nozzle rows 28k1 and 28k2. Further, such problems as follows also occur in the production stage. When joining the piezoelectric actuator 21 to the flow passage unit 20 with an adhesive, the force at adhesion is not uniform due to the different electrode areas between the individual electrodes 32, and thus variation is liable to occur in the thickness of the adhesive. Further, due to the different electrode areas between the individual electrodes 32, difference occurs in the contraction amount of the piezoelectric actuator 21 at firing, and thus variation of residual stress occurs in the piezoelectric actuator 21 after firing. These problems also become factors of differentiating the jetting characteristics between the two nozzle rows 28k1 and 28k2.

Hence, in this embodiment, between the two rows of the individual electrodes 32 aligned, there are equal electrode areas of the sub electrode portions 32b of different shapes (resultantly, equal electrode areas of the individual electrodes 32). In particular, the pullout length is longer for the sub electrode portions 32b pulled out from the main electrode portions 32a in an oblique direction to the longitudinal direction on the right side in FIG. 3 (an example of second sub electrode portions) than for the sub electrode portions 32b pulled out straight from the main electrode portions 32a along the longitudinal direction on the left side in FIG. 3 (an example of first sub electrode portions). However, the width of the sub electrode portions 32b of the individual electrodes 32 on the right side is narrower than that of the sub electrode portions 32b of the individual electrodes 32 on the left side. By virtue of this, the left and right sub electrode portions 32b have different shapes but equal electrode areas. In this manner, by equating the electrode areas for the sub electrode portions 32b of different shapes, between the two rows of the pressure chambers 24 aligned, it is possible to equate the capacitances of the active portions 30a sandwiched by the individual electrodes 32 and the common electrode 33, thereby restraining the variation of the jetting characteristics between the nozzle rows 28k1 and 28k2. Further, the problems occurring in the production process as described hereinbefore are also solved.

Next, an explanation will be given about the driver IC 51 driving the piezoelectric actuator 21. A plurality of drive wires (not shown) formed on the COF 50 are connected to the driver IC 51 mounted on the COF 50. Then, the driver IC 51 is connected to the plurality of individual electrodes 32 via the plurality of drive wires on the COF 50, and the plurality of connection terminals 32*c*. Further, the COF 50 is pulled out along the transport direction from the piezoelectric actuator 21 and then folded upward, and is connected to a control board (not shown) of the ink jet printer 1. By virtue of this, the driver IC 51 is connected electrically to the control board via the wiring on the COF 50. The driver IC 51 receives commands from the control board to output a drive signal having a predetermined voltage, waveform, selectively, to the plurality of individual electrodes 32 of the piezoelectric actuator 21.

If the driver IC 51 applies the drive signal to a certain individual electrode 32, then a potential difference occurs between this individual electrode 32 and the common electrode 33. Hence, an electric field along the thickness direction according to the potential difference acts on the active portion 30*a* which is the portion of the upper piezoelectric layer 30 sandwiched by the individual electrode 32 and the common electrode 33. Further, as described earlier, the active portion 30*a* of the piezoelectric layer 30 is polarized in advance in the thickness direction. Therefore, the direction of the electric field in the active portion 30*a* conforms with the polarization direction, and thus the active portion 30*a* extends in the thickness direction but contracts in the planar direction. On the other hand, because the electric field does not act on the lower piezoelectric layer 31, the piezoelectric layer 31 does not contract in the planar direction. As a result, due to the contraction difference in the planar direction between the upper and lower piezoelectric layers 30 and 31 in the areas facing the pressure chamber 24, the piezoelectric actuator 21 bends to be convex toward the pressure chamber 24 (unimorph deformation). At this time, due to a decrease in the volume of the pressure chamber 24, a pressure (jetting energy) is applied to the ink inside, thereby jetting liquid droplets of the ink from the nozzle 16 in communication with the pressure chamber 24.

However, the individual electrodes 32, to which the drive signal is applied, are electrodes to which a higher potential is applied than to the common electrode 33 at the ground potential. Such electrodes, to which a high potential is applied, are liable to ionize the electrode material and thus give rise to the migration under high-humidity conditions.

How much the migration is likely to occur is due greatly to the metallic material forming the electrodes as well as to environmental conditions such as humidity and the like. However, although the migration occurs as a consequence of ionization of the metallic material, how much the migration is likely to occur does not necessarily consist with the ionization tendency of the metallic material. For example, it is well known that ion migration is likely to occur with Ag which has, however, a small ionization tendency. Some major metallic materials may be ranked as: Ag>Pb≧Cu>Sn>Au, according to the order of likelihood for the migration to occur. That is, Ag is a material wherewith the migration is likely to occur, whereas Au is a material wherewith the migration is extremely unlikely to occur. Further, other than the materials mentioned above, it is said that the migration is less likely to occur with Fe, Pd, and Pt. Further, some reported examples also show that the migration becomes less likely to occur through alloying such as with Ag—Pd, and Ag—Cu.

In this embodiment, because Au is used to form the first electrode layers 38 of the individual electrodes 32 in contact with the piezoelectric layer 30, the migration is less likely to occur with the individual electrodes 32 to which the high potential is applied. However, because Au is expensive, in view of the cost, it is preferable that the first electrode layers 38 are as thin as possible. Further, if the first electrode layers 38 are thick, then they inevitably inhibit the active portions 30*a* from deformation. From this point of view, it is also preferable that the first electrode layers 38 are thin. In this embodiment, therefore, the first electrode layers 38 are very thin films whose thickness is, for example, 1 μm or less. Further, different from Ag or Ag—Pd, Au electrodes are excellent in adhesion to the piezoelectric layer; therefore, separation is still less likely to occur even without adding glass powder. Then, when forming the first electrode layers 38 of Au without adding glass power, the thickness of the first electrode layers 38 becomes less than electrodes formed by Ag or Ag—Pd.

As such, if the first electrode layers 38 of Au are thin, then it is sufficiently conceivable that the first electrode layers 38 break up when crack occurs in the piezoelectric layer 30, etc. Further, as shown in FIG. 3, when the pressure chambers 24 are shaped to be longer in one direction, the active portions 30*a* facing the pressure chambers 24 are liable to crack in the central portions along the lateral direction of the pressure chambers 24. In this regard, in this embodiment, the second electrode layers 39 are stacked on the first electrode layers 38 to extend in the longitudinal direction of the pressure chambers 24 in such a manner as to traverse the central portions of the pressure chambers 24. Thereby, even if crack occurs in some active portion 30*a* along the lateral direction of the pressure chamber 24 and the thin first electrode layer 38 has completely broken up, it is still possible to prevent the individual electrode 32 itself from fracture, by the second electrode layer 39 extending in the longitudinal direction of the pressure chamber 24. Further, because the second electrode layer 39 is formed over the entire length of the first electrode layer 38 in the longitudinal direction, no matter where the crack occurs according to the longitudinal direction of the pressure chamber 24, it is possible to prevent the individual electrode 32 from fracture.

Further, in this embodiment, the second electrode layers 39 are formed by the conductive paste of Ag or Ag—Pd to which glass powder is added. In such cases, the second electrode layers 39 have a porous structure, or a reticulate structure of complicated interwoven glass fibers, and thus are stronger than layers made of metal only for pulling and bending in the planar direction. That is, because the strength of the second electrode layers 39 has increased, even if crack occurs in the piezoelectric layer 30, the second electrode layers 39 are still less likely to break up. Further, by adding glass power to Ag or Ag—Pd, the thickness itself of the second electrode layers 39 becomes greater than that of layers made of a metallic material only. The thickness of the second electrode layers 39 is 2 to 3 μm. From this aspect, the second electrode layers 39 are also less likely to break up.

Further, because the second electrode layers 39 have elongated shapes and are shaped to be narrower in width than the first electrode layers 38, it is less likely to inhibit deformation of the active portions 30*a* of the piezoelectric layer. Further, the second electrode layers 39 are formed of Ag or Ag—Pd, which is more likely to give rise to the migration than gold. In order to prevent the break-up due to the crack, it is possible to increase the thickness itself of the first electrode layers 38 formed of gold. However, because gold is expensive, the cost may rise considerably. On the other hand, as an electrode material, Ag or Ag—Pd is less expensive than gold. Therefore, by using Ag or Ag—Pd to form the second electrode layers 39, it is possible to prevent the individual electrodes from breaking up while keeping the cost low. Further, although Ag or Ag—Pd is a material which is more likely to give rise to the migration than gold, because the first electrode layers 38 of gold lie between the second electrode layers 39 and the piezoelectric layer 30, the second electrode layers 39 do not directly contact with the piezoelectric layer 30. Therefore, even though the second electrode layers 39 are formed of Ag or Ag—Pd, no migration may occur in the second electrode layers 39.

Further, in this embodiment, the connection terminals 32c, to which the COF 50 is connected to supply the drive signal to the individual electrodes 32, are also formed of Ag or Ag—Pd which is a material more likely to cause the migration than gold. Therefore, the migration may also occur with the connection terminal 32c. In this embodiment, however, the connection terminals 32c are stacked on the first electrode layers 38 formed of gold, and thus do not directly contact with the piezoelectric layer 30, thereby preventing the connection terminals 32c from being involved in the migration.

Next, explanations will be given about several modifications which apply various changes to the above embodiment. Note that, however, the same reference numerals will be used to refer to the same components in terms of configuration as those in the above embodiment, any explanation of which will be omitted as appropriate.

Figure 5:
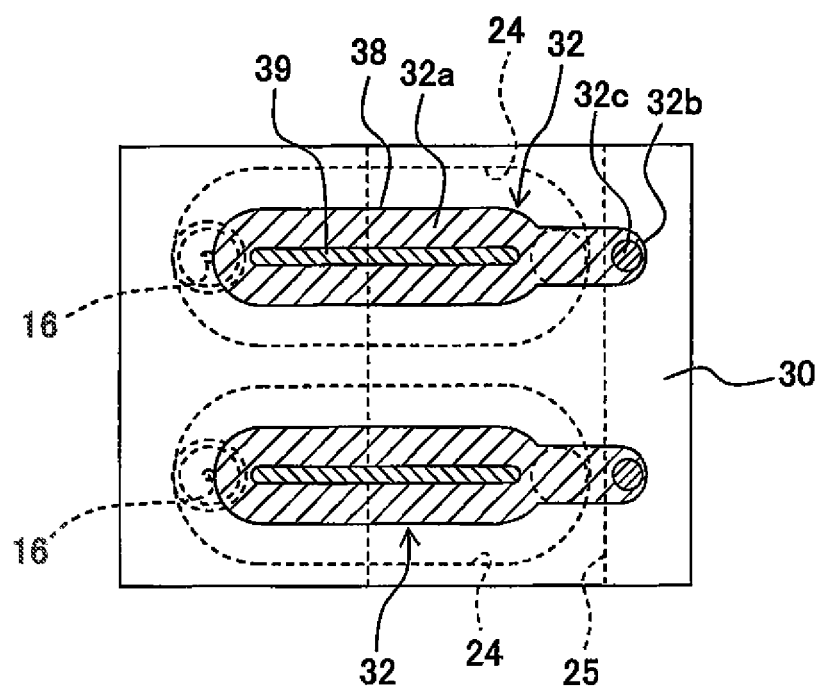
FIG. 5 is a partial enlarged plan view of an ink-jet head in accordance with a modified embodiment.

The second electrode layers 39 do not necessarily extend over the entire length of the first electrode layers 38 but, as shown in FIG. 5, may be provided on parts of the first electrode layers 38 in the longitudinal direction. Further, because crack is more likely to occur in the piezoelectric layer (the active portions 30a) over the central portions of the pressure chambers 24 than over the edge portions of the pressure chambers 24, it is preferable to stack the second electrode layers 39 at least on the central portions of the first electrode layers 38 in the longitudinal direction.

The second electrode layers 39 of the individual electrodes 32 are not limited to a particular extending direction. Over the approximately elliptic pressure chambers 24 of the above embodiment, for example, they may either extend in a direction intersecting the longitudinal direction or extend in the lateral direction perpendicular to the longitudinal direction. Further, it is also possible to appropriately change the extending direction of the second electrode layers 39 according to the shape of the pressure chambers 24. For example, if the pressure chambers 24 are rectangular, then the second electrode layers 39 may also extend in a diagonal direction of the rectangle.

Figure 6:
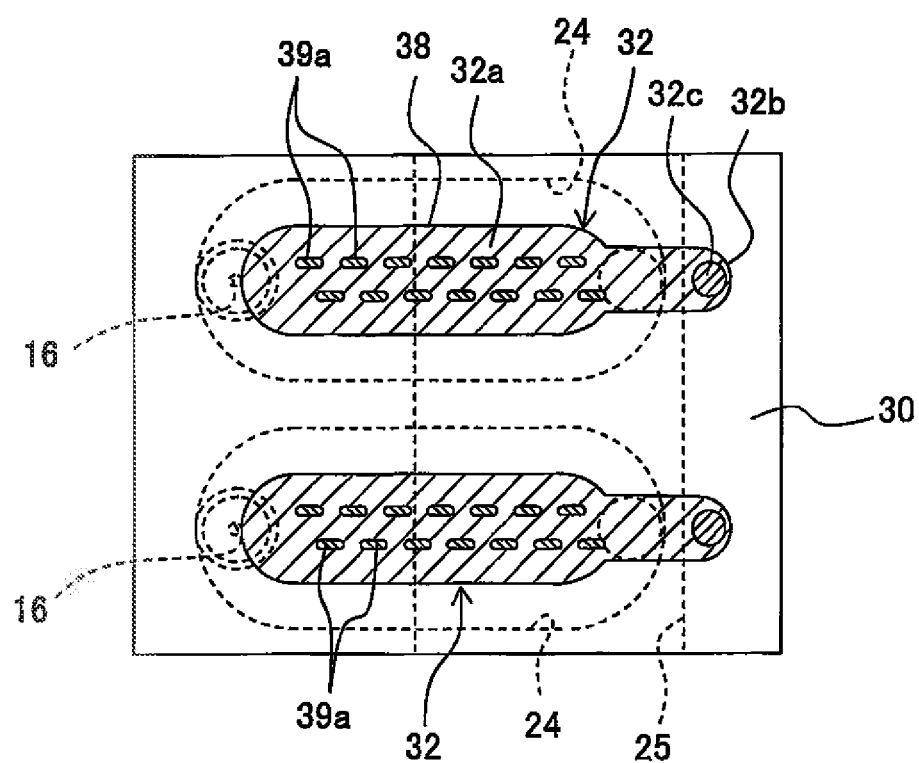
FIG. 6 is a partial enlarged plan view of an ink-jet head in accordance with another modified embodiment.

It is not necessary to form the second electrode layers 39 continuously in a predetermined direction. As shown in FIG. 6, for example, it is also possible to configure each of the second electrode layers 39 to comprise a plurality of conductive portions 39a aligned at intervals between each other in one direction, and to extend to have an elongated shape as a whole along the alignment direction of these conductive portions 39a. However, if the conductive portions 39a have long alignment intervals, then it is not possible to prevent the individual electrodes 32 from fracture when crack occurs in the piezoelectric layer along a direction perpendicular to the alignment direction between some adjacent conductive portions 39a. Therefore, as shown in FIG. 6, it is possible to form a plurality of rows of the conductive portions 39a, and these plurality of rows are positioned to deviate from each other in the alignment direction. In this case, if crack occurs between the conductive portions 39a belonging to one row, then the conductive portions 39a belonging to another row can prevent the individual electrodes 32 from fracture.

The conductive materials used to form the second electrode layers 39 are not limited to those in the above embodiment. For example, besides Ag and Ag—Pd, the conductive portions 39a may also be formed of a metallic material which is more likely to cause the migration than gold. Further, they may not necessarily be formed by the conductive paste of a metallic material to which glass powder is added, but may be electrode layers formed of a metallic material only such as Ag, Ag—Pd, or the like.

Figure 7:
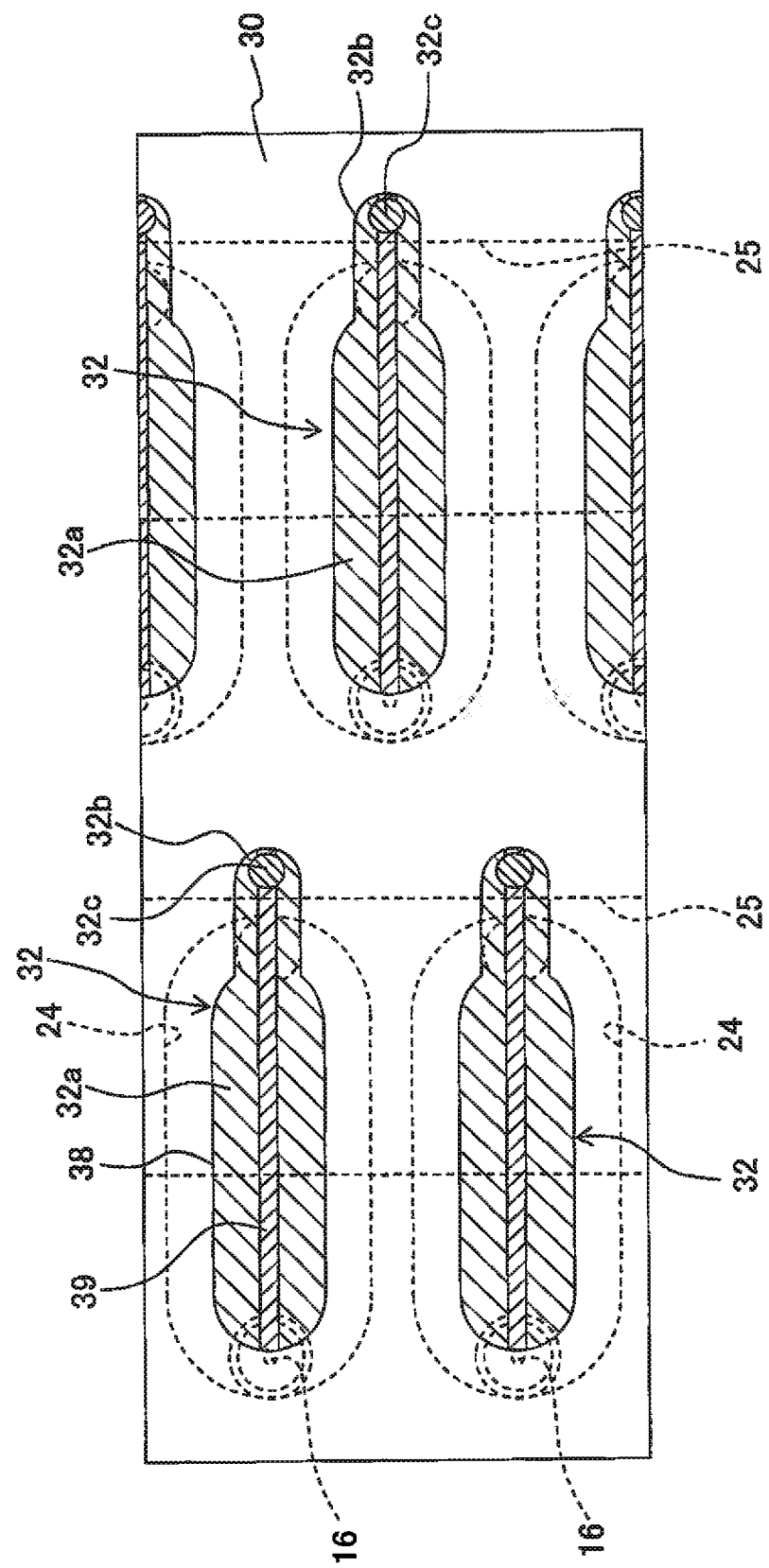
FIG. 7 is a partial enlarged plan view of an ink-jet head in accordance with still another modified embodiment.

In the above embodiment, the sub electrode portions 32b have different shapes between some individual electrodes 32 and the other individual electrodes 32. As shown in FIG. 7, however, the sub electrode portions 32b may also have the same shape for all individual electrodes 32.

Figure 8:
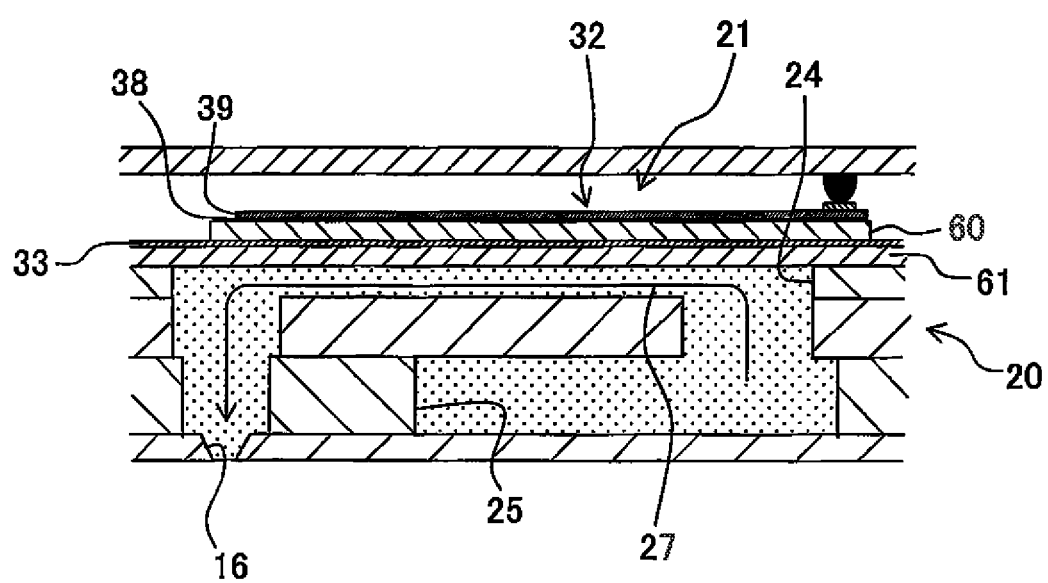
FIG. 8 is a cross-sectional view of an ink-jet head in accordance with still another modified embodiment, corresponding to FIG. 4A.

In the above embodiment, the piezoelectric layer 30, which is sandwiched by the individual electrodes 32 and the common electrode 33 and on which the electric field acts, is configured to commonly cover the plurality of pressure chambers 24. However, it is also possible to configure the piezoelectric layer to be provided independently for each of the pressure chambers 24. As shown in FIG. 8, for example, a vibration plate 61 may be joined to the flow passage unit 20 to commonly cover the plurality of pressure chambers 24 and, on the upper surface of this vibration plate 61, a plurality of piezoelectric layers 60 may be individually formed in areas respectively facing the plurality of pressure chambers 24.

In the above embodiment, the connection terminals 32c for connection with the COP 50 are provided at the sub electrode portions 32b of the individual electrodes 32. However, without providing the connection terminals 32c, the COF 50 may be connected to some portions of the individual electrodes 32 not overlapping with the pressure chambers 24.

The embodiment and its modifications explained above are merely examples of applying the present invention to an ink-jet head, i.e., a liquid droplet jetting apparatus. However, the piezoelectric actuator of the present invention is not limited to being used for the purpose of applying pressure to liquid. For example, it may also be used for the purpose of causing solid matters to generate displacement, vibration, and the like.

What is claimed is:

1. A liquid droplet jetting apparatus configured to jet liquid droplets of a liquid, comprising:
    a flow passage structural body having a nozzle through which the liquid droplets are jetted and a pressure chamber communicated with the nozzle; and
    a piezoelectric actuator provided on the flow passage structural body and configured to apply jetting energy to the liquid inside the pressure chamber;
    wherein the piezoelectric actuator has:
        a piezoelectric layer arranged to face the pressure chamber;
        a low-potential electrode provided on the piezoelectric layer; and
        a high-potential electrode provided on the piezoelectric layer and configured to be applied a potential which is higher than a potential to be applied to the low-potential electrode; and
    wherein the high-potential electrode has:
        a first electrode layer arranged to make contact with the piezoelectric layer and formed of gold; and
        a second electrode layer stacked on the first electrode layer, the second electrode layer:
            extending in a first direction which is along the piezoelectric layer and in a second direction which is along the piezoelectric layer and intersects with the first direction;

having a length in the first direction which is longer than a length in the second direction;

having the length in the second direction which is shorter than a length of the first electrode layer in the second direction; and being formed of a conductive material which is more likely to cause migration than gold.

2. The liquid droplet jetting apparatus according to claim 1;
wherein the pressure chamber has a length in the first direction which is longer than a length in the second direction; and
the first electrode layer has a length in the first direction which is longer than the length in the second direction.

3. The liquid droplet jetting apparatus according to claim 2;
wherein the second electrode layer is formed over the entire length in the first direction of the first electrode layer.

4. The liquid droplet jetting apparatus according to claim 1;
wherein the conductive material has glass powder.

5. The liquid droplet jetting apparatus according to claim 1;
wherein the high-potential electrode has a connection terminal configured to be connected to a wiring member for applying the potential to the high-potential electrode;
wherein the connection terminal is formed of the conductive material which is more likely to cause the migration than gold; and
wherein the connection terminal is stacked on the first electrode layer formed of gold, and does not directly make contact with the piezoelectric layer.

6. The liquid droplet jetting apparatus according to claim 5;
wherein the second electrode layer and the connection terminal are formed of a same material.

7. The liquid droplet jetting apparatus according to claim 1;
wherein in the flow passage structural body; the pressure chamber is formed as a plurality of pressure chambers;
wherein the high-potential electrode is provided on the piezoelectric layer as a plurality of high-potential electrodes corresponding to the plurality of pressure chambers respectively;
wherein each of the plurality of high-potential electrodes has:
   a main electrode portion facing one pressure chamber of the pressure chambers;
   a sub electrode portion pulled out from the main electrode portion extending toward a position facing outside of the one pressure chamber; and
   a connection terminal formed at the sub electrode portion and to be connected to a wiring member for applying a potential to the high-potential electrodes; and
wherein a plurality of sub electrode portions of the plurality of high-potential electrodes include first sub electrode portions and second sub electrode portions which are different in shape from the first sub electrode portions, and an area of each of the first sub electrode portions is equal to an area of each of the second sub electrode portions.

8. The liquid droplet jetting apparatus according to claim 1;
wherein the second electrode layer is formed of one of silver and silver-palladium alloy.

9. A piezoelectric actuator comprising:
a piezoelectric layer;
a low-potential electrode provided on the piezoelectric layer; and
a high-potential electrode provided on the piezoelectric layer and configured to be applied a potential which is higher than a potential to be applied to the low-potential electrode;
wherein the high-potential electrode has:
   a first electrode layer arranged to make contact with the piezoelectric layer and formed of gold; and
   a second electrode layer stacked on the first electrode layer, the second electrode layer:
      extending in a first direction which is along the piezoelectric layer and in a second direction which is along the piezoelectric layer and intersects with the first direction;
      having a length in the first direction which is longer than a length in the second direction;
      having the length in the second direction which is shorter than a length of the first electrode layer in the second direction; and
      being formed of a conductive material which is more likely to cause migration than gold.

10. The liquid droplet jetting apparatus according to claim 1;
wherein the first electrode layer is thinner than the second electrode layer.

11. The piezoelectric actuator according to claim 9;
wherein the first electrode layer is thinner than the second electrode layer.

12. The liquid droplet jetting apparatus according to claim 2;
wherein the first electrode layer has:
   a main electrode portion facing the pressure chamber; and
   a sub electrode portion pulled out from the main electrode portion and extending toward a position facing outside of the one pressure chamber; and
wherein the second electrode layer is formed over the entire length in the first direction of the main electrode portion of the first electrode layer.

13. The liquid droplet jetting apparatus according to claim 5;
wherein the second electrode layer is formed to extend from the connection terminal to one end portion of the first electrode layer in the first direction.

* * * * *